US010931948B2

(12) United States Patent
Potempa et al.

(10) Patent No.: US 10,931,948 B2
(45) Date of Patent: Feb. 23, 2021

(54) ENHANCED IMAGE COMPRESSION WITH CLUSTERING AND LOOKUP PROCEDURES (71) Applicant: Google LLC, Mountain View, CA (US)

(72) Inventors: Krzysztof Potempa, Zurich (CH); Jyrki Alakuijala, Wollerau (CH); Robert Obryk, Zürich (CH)

(73) Assignee: Google LLC, Mountain View, CA (US)

( * ) Notice: Subject to any disclaimer, the term of this patent is extended or adjusted under 35 U.S.C. 154(b) by 205 days.

(21) Appl. No.: 15/985,317

(22) Filed: May 21, 2018

(65) Prior Publication Data
US 2019/0356916 A1 Nov. 21, 2019

(51) Int. Cl.
H04N 19/122 (2014.01)
H04N 19/176 (2014.01)
H04N 19/625 (2014.01)

(52) U.S. Cl.
CPC ......... H04N 19/122 (2014.11); H04N 19/176 (2014.11); H04N 19/625 (2014.11)

(58) Field of Classification Search
CPC .. H04N 19/122; H04N 19/176; H04N 19/625; H04N 19/85; G06K 9/6255; G06K 9/6219; G06K 9/6247; H03M 7/3077; H03M 7/3088
See application file for complete search history.

(56) References Cited

U.S. PATENT DOCUMENTS

| | | | |
|---|---|---|---|
| 6,771,828 B1 * | 8/2004 | Malvar | G06F 17/147 375/240.11 |
| 8,515,193 B1 | 8/2013 | Han et al. | |
| 8,666,186 B1 | 3/2014 | Rasche | |
| 9,326,000 B2 | 4/2016 | Zhao et al. | |
| 2015/0264348 A1 * | 9/2015 | Zou | H04N 19/70 375/240.02 |
| 2015/0264372 A1 * | 9/2015 | Kolesnikov | H04N 19/52 375/240.16 |

(Continued)

OTHER PUBLICATIONS

International Search Report and Written Opinion for Application No. PCT/US2019/032591, dated Aug. 21, 2019, 17 pages.

(Continued)

Primary Examiner — Yon J Couso
(74) Attorney, Agent, or Firm — Brake Hughes Bellermann LLP (57) ABSTRACT An image encoder includes a processor and a memory. The memory includes instructions configured to cause the processor to perform operations. In one example implementation, the operations may include determining whether a dictionary item is available for replacing a block of an image being encoded, the determining based on a hierarchical lookup mechanism, and encoding the image along with reference information of the dictionary item in response to determining that the dictionary item is available. In one more example implementation, the operations may include performing principal component analysis (PCA) on a block to generate a corresponding projected block, the block being associated with a group of images, comparing the projected block with a corresponding threshold, descending the block recursively based on the threshold until a condition is satisfied, and identifying a left over block as a cluster upon satisfying of the condition.

19 Claims, 7 Drawing Sheets (56) References Cited

U.S. PATENT DOCUMENTS

2019/0124355 A1* 4/2019 Zhao .................... H04N 19/105

OTHER PUBLICATIONS

Wikipedia, "Otsu's Method", Jan. 12, 2017, 9 pages.
Kang et al.; "Efficient Dictionary Based Video Coding With Reduced Side Information"; Circuits and Systems, 2011 IEEE International Symposium, May 15, 2011, pp. 109-112.

* cited by examiner

```
┌─────────────────────────────────────────────────────────────┐
│ Determine, at an encoder, whether a dictionary item is      │
│ available for replacing a block of an image being encoded,  │
│ the determining based on a hierarchical lookup mechanism 510│
└─────────────────────────────────────────────────────────────┘
                              │
                              ▼
┌─────────────────────────────────────────────────────────────┐
│ Encode, at the encoder, the image along with reference      │
│ information of the dictionary item in response to determining│
│ that the dictionary item is available 520                   │
└─────────────────────────────────────────────────────────────┘
                              │
                              ▼
┌─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
│ Receive, by the encoder, a dictionary that includes the     │
│ dictionary item 530                                         │
└─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
```

ENHANCED IMAGE COMPRESSION WITH CLUSTERING AND LOOKUP PROCEDURES

FIELD

This application relates, generally, to compressing images.

BACKGROUND

Lossy image compression is generally performed using integral transforms of image pixels (e.g., 8×8 pixels) and any type of integral transform, e.g., discrete cosine transform (DCT), discrete sine transform (DST), Hadamard, Gabor, Wavelet, etc. may be used. However, the integral transform process may result in characteristic errors. These characteristic errors may give the compressed image a characteristic look and may increase group errors that may be identified as striping or banding in the uncompressed image, and thereby negatively affecting user experience.

SUMMARY

In one aspect, an image encoder includes a processor and a memory. The memory includes instructions configured to cause the processor to perform operations. In one example implementation, the operations may include determining whether a dictionary item is available for replacing a block of an image being encoded, the determining based on a hierarchical lookup mechanism, and encoding the image along with reference information of the dictionary item in response to determining that the dictionary item is available. In one more example implementation, the operations may include performing principal component analysis (PCA) on a block to generate a corresponding projected block, the block being associated with a group of images, comparing the projected block with a corresponding threshold, descending the block recursively based on the threshold until a condition is satisfied, and identifying a left over block as a cluster upon satisfying of the condition.

BRIEF DESCRIPTION OF THE DRAWINGS

Example implementations will become more fully understood from the detailed description given herein below and the accompanying drawings, wherein like elements are represented by like reference numerals, which are given by way of illustration only and thus are not limiting of the example implementations and wherein.

It should be noted that these Figures are intended to illustrate the general characteristics of methods, structure, or materials utilized in certain example implementations and to supplement the written description provided below. These drawings are not, however, to scale and may not precisely reflect the precise structural or performance characteristics of any given implementation, and should not be interpreted as defining or limiting the range of values or properties encompassed by example implementation. The use of similar or identical reference numbers in the various drawings is intended to indicate the presence of a similar or identical element or feature.

DETAILED DESCRIPTION

An example image encoding (or compression) procedure is described herein. The image encoding procedure may include a transform process (e.g., DCT transform) to transform an image which has been split into blocks (e.g., 8×8 blocks) from a pixel domain into a frequency domain. In one implementation, instead of encoding a block (e.g., one or more blocks of the image) which may include quantizing and entropy encoding, the block may be replaced by a dictionary item (e.g., a dictionary item of a dictionary) that closely matches the block. In other words, instead of proceeding with the encoding of DCT coefficients associated with the block, reference information associated with a dictionary item that closely matches the block may be used to replace the block. The replacing of a block with a dictionary item may occur when a dictionary item that closely matches the block is available in the dictionary (e.g., the dictionary item does not have to be an exact match). The use of the dictionary item eliminates the need for encoding of frequency domain coefficients of the block. During the decoding process, a decoder uses the dictionary item in the dictionary to successfully decode the image. That is, the decoder inserts the dictionary item in place of the block to complete the decoding process. This procedure reduces the amount of data to be transferred from the encoder to the decoder as the size of the encoded image has been reduced by using dictionary items instead of compressing blocks when a dictionary item that matches the block is available in the dictionary. In other words, the decoder performs the decoding using the dictionary item.

In some implementations, an encoder may pre-process a set of images to determine whether there are features (also referred to as clusters) that are common across the set of images. If the encoder determines that some features are common across the set of images, the encoder may store the features or clusters together in the dictionary. For example, the encoder may identify, e.g., 100 features or clusters, that are common across the set of images. The encoder may store them together in the dictionary and identify them using dictionary item numbers. For example, a vertical line may be referred to as item #25 in the dictionary and may be used by the encoder when encoding an image which may contain a vertical line. The process of grouping together a group of features that are common across a set of images may be referred to as grouping or clustering and the items in the groups may be used using a lookup table.

Figure 1:
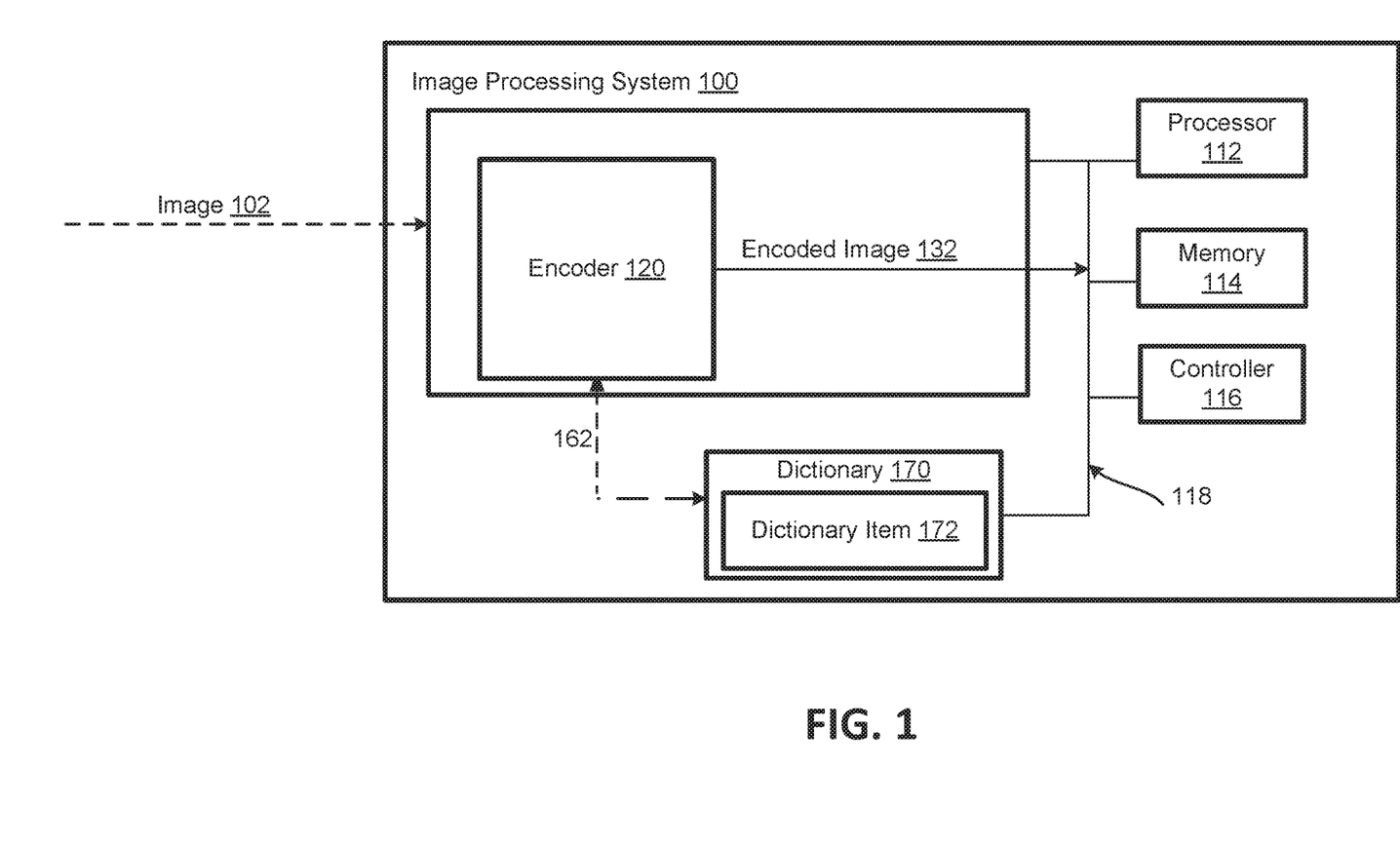
FIG. 1 illustrates a block diagram of an image processing system according to at least one example implementation.

FIG. 1 illustrates a block diagram of an example image processing system 100 for encoding images.

As shown in FIG. 1, the example image processing system 100 may include at least one processor 112, at least one memory 114, a controller 116, an encoder 120, and an application 170. The at least one processor 112, the at least one memory 114, the controller 116, the encoder 120, and the application 170 may be communicatively coupled via bus 118.

The at least one processor 112 may be utilized to execute instructions stored on the at least one memory 114, so as to thereby implement the various features and functions described herein, or additional or alternative features and functions. The at least one processor 112 and the at least one memory 114 may be utilized for various other purposes. For example, the at least one memory 114 may represent an example of various types of memory and related hardware and software, or a combination thereof, which may be used to implement any one of the components or modules described herein.

The at least one memory 114 may be configured to store data or information associated with the image processing system 100. For example, the at least one memory 114 may be configured to store codecs (e.g., encoder 120), images (e.g., image 102), encoded images (e.g., encoded image 132), dictionary (e.g., dictionary 170, dictionary item 172) and any reference information (e.g., reference information 174). The at least one memory 114 may be a shared resource. For example, the image processing system 100 may be an element of a larger system (e.g., a server, a personal computer, a mobile device, and the like). Therefore, the at least one memory 114 may be configured to store data or information associated with other elements (e.g., image/video serving, web browsing, or wired/wireless communications) within the larger system.

The controller 116 may be configured to generate various control signals and communicate the control signals to various blocks in the image processing system 100. The controller 116 may be configured to generate the control signals to implement the techniques (e.g., mechanisms, procedures, etc.) described herein. The controller 116 may be configured to control the encoder 120 to encode an image, a plurality of images, and the like according to example implementations or aspects. For example, the controller 116 may generate control signals corresponding to parameters to implement an encoding mechanism.

In one example implementation, the encoder 120 may determine whether a dictionary item (e.g., dictionary item 172) is available for replacing a block of an image being encoded and encoding the image (e.g. image 102) along with reference information (e.g., reference information 174) associated with the block in response to determining that the dictionary item is available.

Figure 2:
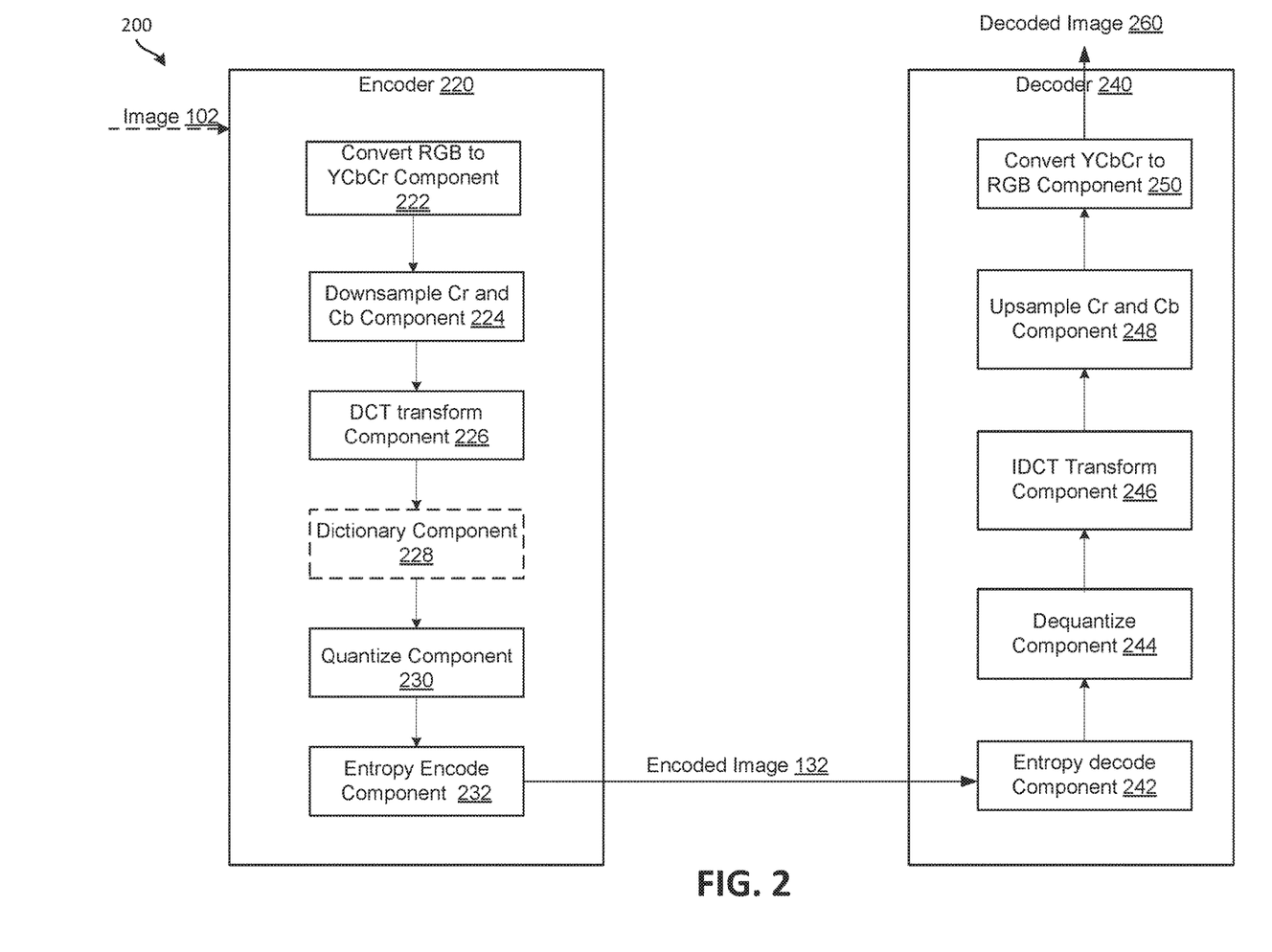
FIG. 2 illustrates a block diagram of an image processing system according to at least another example implementation.

FIG. 2 illustrates a block diagram of an image processing system 200 according to at least one example implementation.

As shown in FIG. 2, an encoder 220 (which may be same or similar to the encoder 120 of FIG. 1) may include a convert RGB to YCbCr component 222, a downsample Cr and Cb component 224, a DCT transform component 226, a dictionary component 228, a quantize component 230, and an entropy encode component 232. The decoder 240 may include an entropy decode component 242, a dequantize component 244, an IDCT transform component 246, an upsample Cr and Cb component 248, and a convert YCbCr to RGB component 250. In some implementations, the decoder 220 may receive the encoded image 132 from the encoder 220, and may perform decoding to generate decoded image 260.

In one implementation, the convert RGB to YCbCr component 222 may be configured to convert the RGB (e.g., red, green, and blue) values of pixels in a source image, e.g., image 102, to YCbCr (e.g., luminance and chrominance) values. For example, ITU-RBT.601 establishes the following formulas for converting from the RGB color space to the YCbCr color space:

$$Y = 0.299R + 0.587G + 0.114B \quad (1)$$

$$Cb = 0.564(B-Y) \quad (2)$$

$$Cr = 0.713(R-Y) \quad (3)$$

In some implementations, the color space conversion may be implemented using multipliers or look-up tables to achieve the multiplication operations, and by combining the resultant component products to complete the conversion. In an example implementation, a 3-by-3 multiplication may be used for converting between any two color spaces of three color components. To perform the RGB to YCbCr color space conversion using equations (1) to (3), convert RGB to YCbCr component 222 may be configured to perform (or instruct a processor, e.g., processor 112, to perform) three multiplication operations to obtain the Y color signal, and then derive the (B−Y) and (R−Y) color difference signals before performing two more multiplication operations to obtain the Cb and Cr color signals, respectively.

The downsample Cr and Cb component 224 may be configured to separate the Y, Cr, and Cb into three image planes. For example, the Y values may be fully sampled and the Cr and the Cb values may be down sampled as, for example, a $\frac{1}{4}^{th}$ vertical and horizontal downsample of the Cr and the Cb values.

The discrete cosine transform (DCT) transform component 226 may be configured to convert the values of the pixels from a spatial domain to transform coefficients in a transform domain. The transform coefficients may correspond to a two-dimensional matrix of coefficients that are the same size as the original block. In other words, there may be as many transform coefficients as pixels in the original block. The DCT transform component 226 may be configured to transform the pixel values of a block into transform coefficients in, for example, the frequency domain. The transform coefficients may include Karhunen-Loève Transform (KLT), Discrete Cosine Transform (DCT), or Singular Value Decomposition Transform ("SVD").

In some implementations, prior to quantize component 230 quantizing the DCT coefficients, the encoder 220 or the dictionary component 228 may determine whether a dictionary item 172 is available in the dictionary 170 that could replace a block to be encoded (or being encoded). In other words, the encoder 220 may determine whether the dictionary item 172 is available in the dictionary 170 that could be used to replace the block so that further encoding of the block may be skipped. In some implementations, the dictionary 170 and/or the dictionary item(s) 172 may be built by the encoder 220 by processing a set of images and identifying a plurality of features that may be stored together so that the encoder 220 may use the dictionary items during the encoding process. For instance, in one example, a dictionary item may be referred to as dictionary item #25.

The quantize component 230 may be configured to reduce data in each transformation coefficient. Quantization may involve mapping values within a relatively large range to values in a relatively small range, thus reducing the amount of data needed to represent the quantized transform coefficients. The quantize component 230 may convert the transform coefficients into discrete quantum values, which may be referred to as quantized transform coefficients or quantization levels. For example, an encoding standard may define 128 quantization levels in a scalar quantization process.

The entropy encode component 232 may be configured to perform entropy encoding (e.g., Huffman encoding, arithmetic encoding, etc.) to the blocks. After encoding all the blocks that correspond to the source image (e.g., image 102), the encoder 220 may generate an encoded image (e.g., encoded image 132), also referred to as encoded bitstream.

The entropy decode component 242 may be configured to perform entropy decoding (e.g., Huffman decoding) of the encoded blocks (or bitstream). In performing the entropy decoding, the entropy decode component 242 may determine the blocks in the order (e.g., location) in which they were encoded. However, the entropy decode component 242 may not be able to determine the location of a block before the entropy decode component 242 entropy decodes at least one preceding block because the encoded blocks do not have a fixed size and there are no markers demarcating block boundaries. Therefore, for a block to be decoded, the preceding blocks (e.g., in the bitstream or the encoded image 102) should be entropy decoded in order to determine the location of the requested block. The dequantize component 244 may be configured to dequantize the quantized transform coefficients. For example, in some implementations, one DC coefficient and 63 AC coefficients may be generated for each block (e.g., a minimum coded unit (MCU)) and may be stored (e.g., temporarily) in a memory (e.g., memory 114) for retrieval by the decoder 240.

In some implementations, once dequantize component 244 generates the DC coefficients and the AC coefficients, IDCT transform component 246 may be configured to perform IDCT operations (e.g., using the DC coefficients and the AC coefficients) to inverse transform the dequantized transform coefficients to produce a derivative residual that may be identical to that created by the downsample Cr and Cb component 224 during the encoding process. The upsample Cr and Cb component 248 and the convert YCbCr to RGB component 250 upsample the Cr and the Cb values and convert the YCbCr values to RGB using inverse algorithms (as compared to the convert RGB to YCbCr component 222 and the downsample Cr and Cb component 224) to generate RGB values for display, for the decoded image 260.

Figure 3:
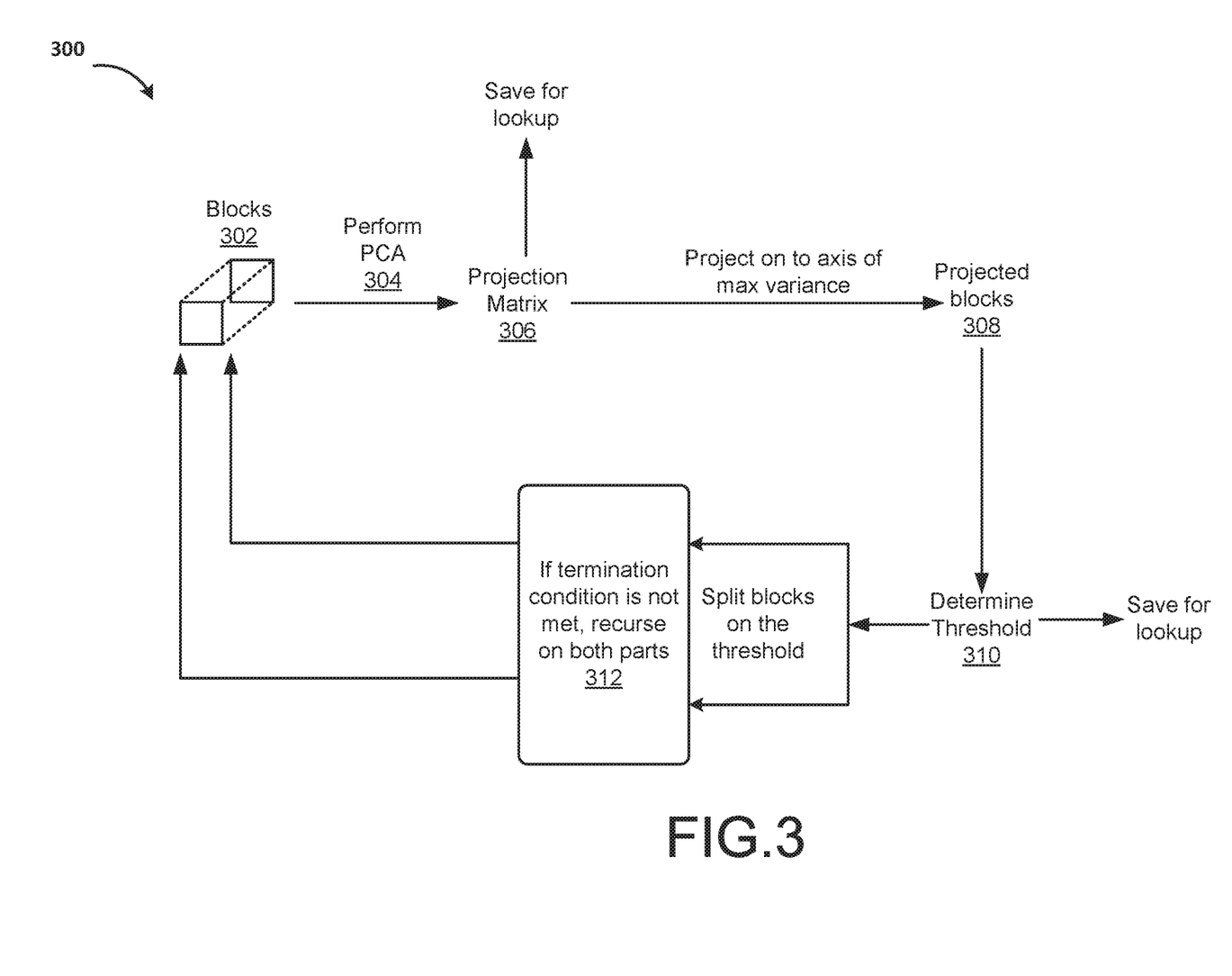
FIG. 3 illustrates an example clustering mechanism according to at least one example implementation.

FIG. 3 illustrates an example clustering mechanism 300 according to at least one example implementation. The clustering mechanism 300 is not limited for DCT coefficients of image blocks but can also be used for any type of data that could be expressed as fixed-length sequences of numbers.

The clustering mechanism generates (or creates) clusters from a set of blocks (e.g., block 302). The blocks 302 may be associated with a plurality of images. The clustering mechanism 300 starts with the processing of the blocks 302. In some implementations, each of the blocks may be an 8×8 matrix and each block may be associated with a feature. For instance, a vertical line may be considered as a feature. Principal component analysis (PCA) 304 may be performed on the blocks 302 using a projection matrix 306 to generate projected blocks 308. The projected blocks 308 may be generated by projecting the projection matrix 306 onto an axis of maximum variance. The axis of maximum variance determines the direction (e.g., in a 64 dimension space) along which the blocks are most diverse. A projected block may be a sequence of 64 values.

An threshold (e.g., threshold 310) may be determined for each of the projected blocks 308. A threshold 310 for a projected block may be determined, for example, using Otsu's method, which is used to perform clustering-based image thresholding. Once the threshold of a projected block is determined, the projected block may be split into two parts based on the threshold. That is, a sequence of a projected block may be split into two sequences based on the threshold for the projected block. In some implementations, for example, the projected block may be split into two parts based on comparing to the threshold, a first part that includes a first set of values that are equal to or above the threshold and a second part that include a second set of values that are below the threshold.

The splitting of the projected blocks continues, for example, recursively, until a condition (e.g., a termination condition) is satisfied. The condition may be considered satisfied when further splitting of the blocks is not possible (e.g., only one block left over). In some implementations, upon the termination of the splitting of the blocks, the left over block (e.g., output of splitting) may be considered as a cluster and added to the dictionary 170, for example, as a dictionary item 172.

The mechanism described above generates clusters (or dictionary items) from a set of blocks associated with a plurality of images. As shown in FIG. 3, the projection matrix 306 and the thresholds 310 are stored for executing a lookup mechanism 400 of FIG. 4 as described below in reference to FIG. 4.

Figure 4:
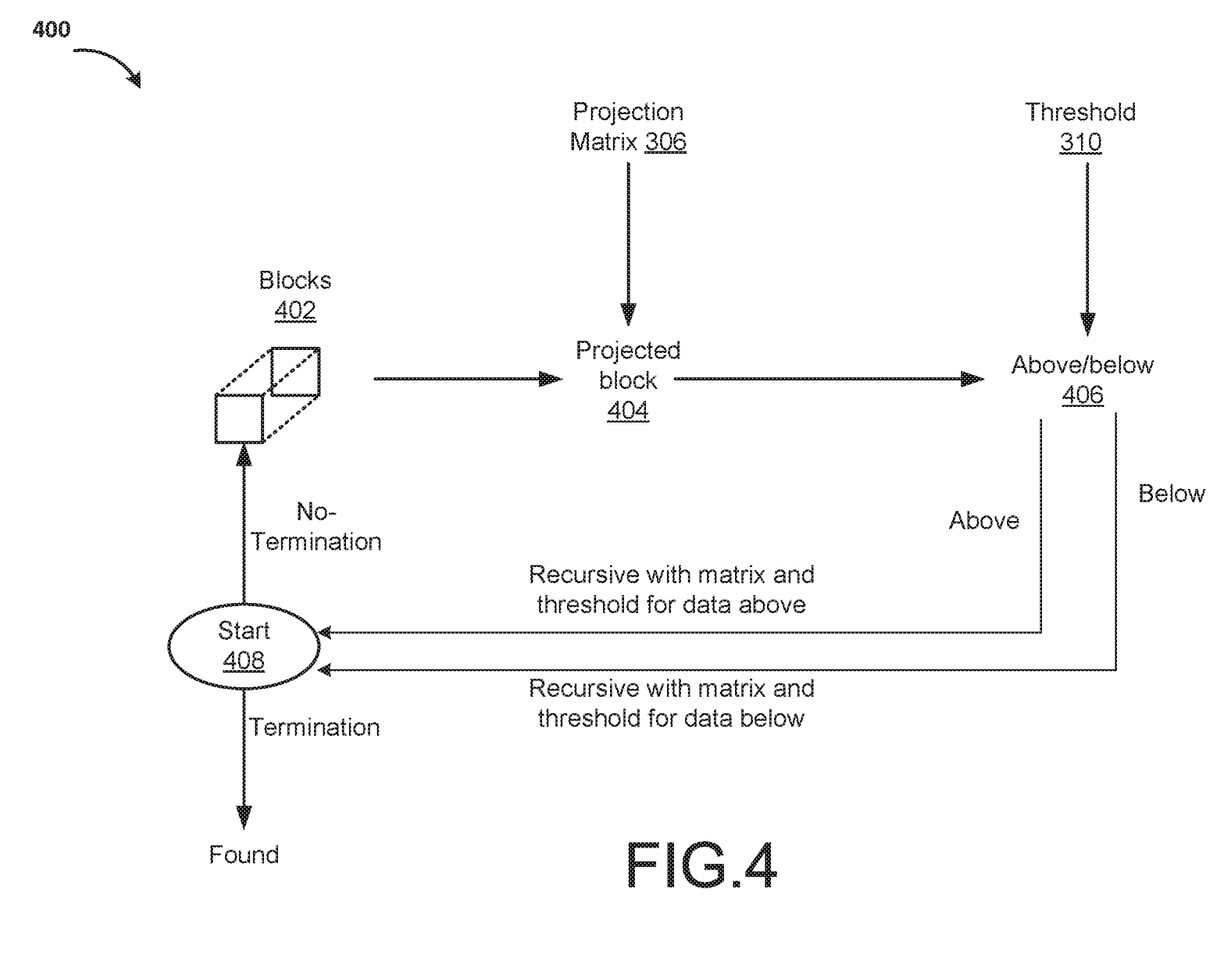
FIG. 4 illustrates an example lookup mechanism according to at least one example implementation.

FIG. 4 illustrates an example lookup mechanism 400 according to at least one example implementation. The lookup mechanism 400 determines whether a block that is similar (or very similar) is available in the dictionary 170 and/or proceeds along the hierarchy (e.g., recursively) to determine the closest match in the split blocks.

In one implementation, the input to the lookup mechanism 400 may include a block (e.g., block 402), a projection matrix (e.g., projection matrix 306), and a threshold (e.g., threshold 310). The projection matrix and the threshold may be generated, for example, by the clustering mechanism 300 of FIG. 3.

The lookup mechanism 400 may include generating a projected block (e.g., projected block 404) based on the projection matrix. The generating of the projected block may be based on the projection matrix that may be projected onto an axis of maximum variance, as described above in reference to FIG. 3. The projected block may include (e.g., contain) a sequence of 64 values that is compared 406 with a threshold (e.g., threshold 310) to determine whether the sequence is above or below the threshold value 310. In some implementations, for example, the comparing may be based on comparing the sum of the squares of the difference.

In some implementations, if it is determined that the sequence is above (or equal to) the threshold value, the lookup mechanism recursively considers the projection matrix and a threshold corresponding to a upper portion, and if it is determined that the sequence is below the threshold, the lookup mechanism recursively considers the projection matrix and a threshold corresponding to a lower portion. The recursive descending (e.g., processing, walking along, etc.) continues 408 until a condition (e.g., a termination condition) is met. The splitting ends when no further splitting is possible, and the cluster being considered at that time is chosen as a matching cluster.

Figure 5A:
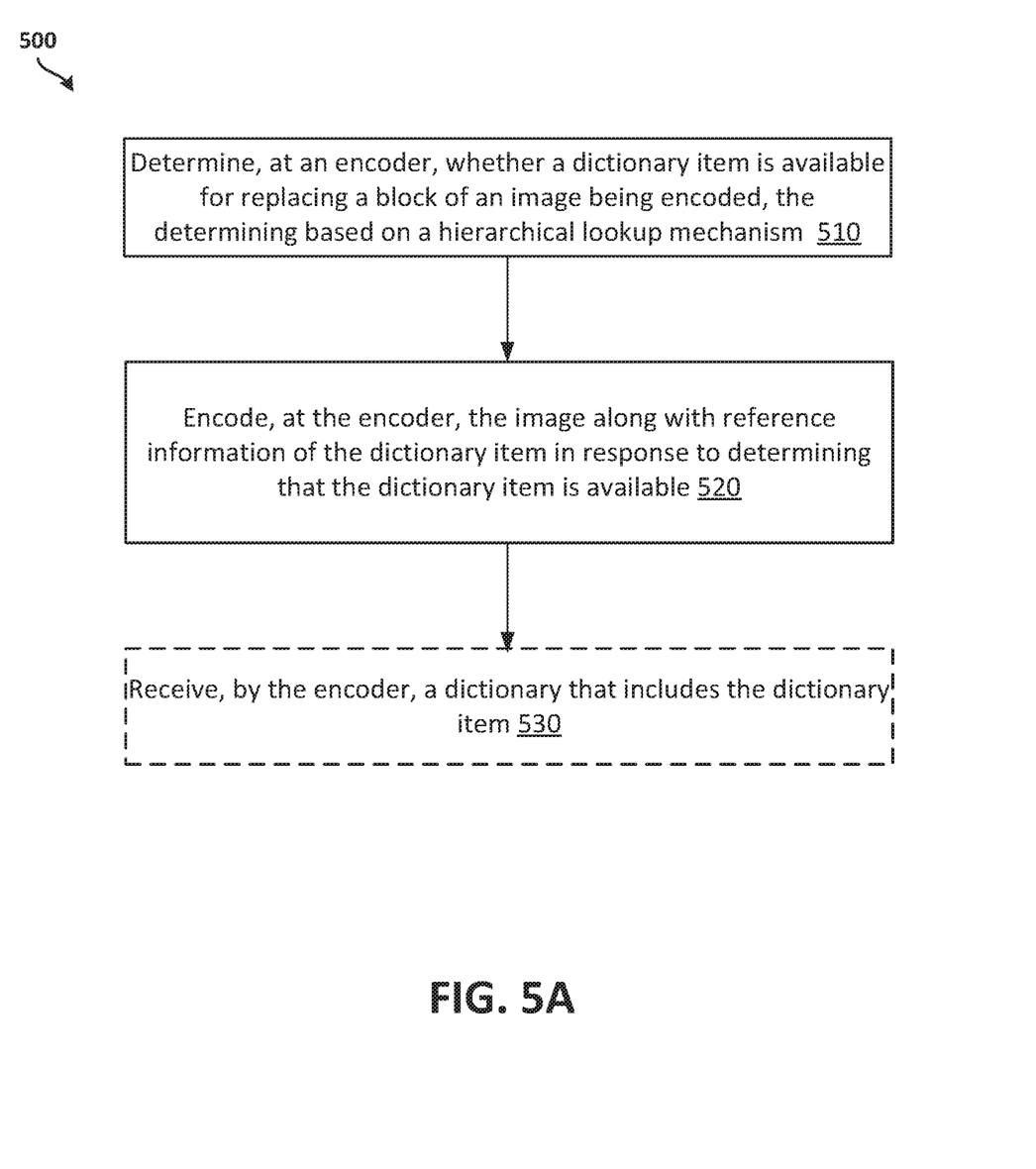
FIG. 5A illustrates a flowchart of a method of performing clustering according to least one example implementation.

FIG. 5A illustrates a flowchart 500 of a method of encoding an image according to least one example implementation.

At block 510, the encoder 120 may determine whether a dictionary item is available for replacing a block of an image being encoded. For example, in some implementations, as described above in reference to FIG. 2, the encoder 220 (or encoder 120) may determine whether a dictionary item (the dictionary item 172 may be a feature) is available for replacing a block of an image being encoded. The encoder 220 may determine whether a dictionary item associated with the block (e.g., closely matches the block) is available based on a hierarchical lookup mechanism described above in reference to FIG. 4. The encoder 220 may refer to the associated dictionary item instead of further processing or encoding of the block. If the encoder 220 determines that the dictionary item is available, the encoder 220 may skip further processing (e.g., quantizing, entropy encoding) of the block, and may instead simply refer to the dictionary item during the encoding process.

At block 520, the encoder may encode the image along with reference information associated with the block in response to determining that the dictionary item is available. For example, in some implementations, in response to the encoder 220 determining that the dictionary item is available, the encoder 220 may encode the image along with the reference information associated with the block. That is, the encoder replaces the block with the reference information associated with the block. The reference information associated with the block may be available in the dictionary 170. In some implementation, during the decoding process, the reference information allows the decoder 260 to copy the dictionary item (e.g., which is similar or very similar to the block) from the dictionary 170 to complete the decoding process. In other words, the decoder replaces the reference information of the dictionary item with the dictionary item.

In some implementations, at block 530, the encoder may receive a dictionary that includes the dictionary item. In a typical scenario, the dictionary 170 would be created ahead of time and distributed to both the encoder 220 and the decoder 260. As the encoder 220 may have replaced a block with the reference information associated with the block (e.g., dictionary item), the decoder 260 needs the dictionary item to successfully complete the decoding process. Thus, by using reference information of the dictionary items during the encoding process, the encoder 220 reduces the size of encoded images.

Figure 5B:
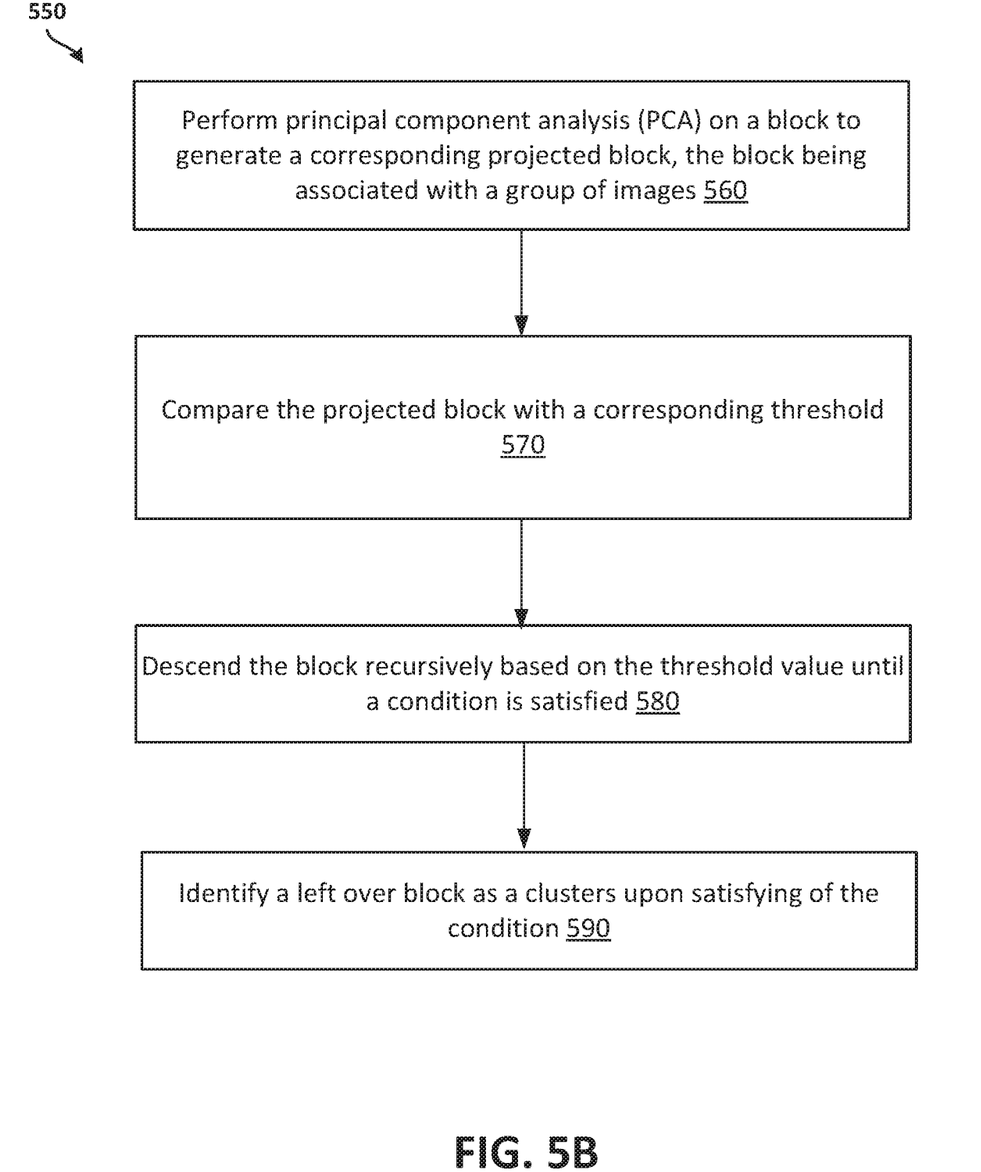
FIG. 5B illustrates a flowchart of a method of performing lookup mechanism according to least one example implementation.

FIG. 5B illustrates a flowchart 550 of a lookup mechanism according to least one example implementation.

At block 560, the encoder 220 may perform principal component analysis (PCA) on a block to generate a corresponding projected block. The block may be associated with a group of images. At block 570, the encoder 220 may compare the projected block with a corresponding threshold. At block 580, the encoder 220 may recursively process a subset of the dictionary (e.g., recursively descend) based on a threshold until a condition is satisfied. At block 590, the encoder 220 may identify a left over block as a cluster upon satisfying of the condition. In some implementations, for example, as described above in reference to FIG. 4, the encoder 220 may determine whether a dictionary item associated with a block of the image being encoded is available based on the hierarchical lookup mechanism described above in reference to FIG. 4.

Figure 6:
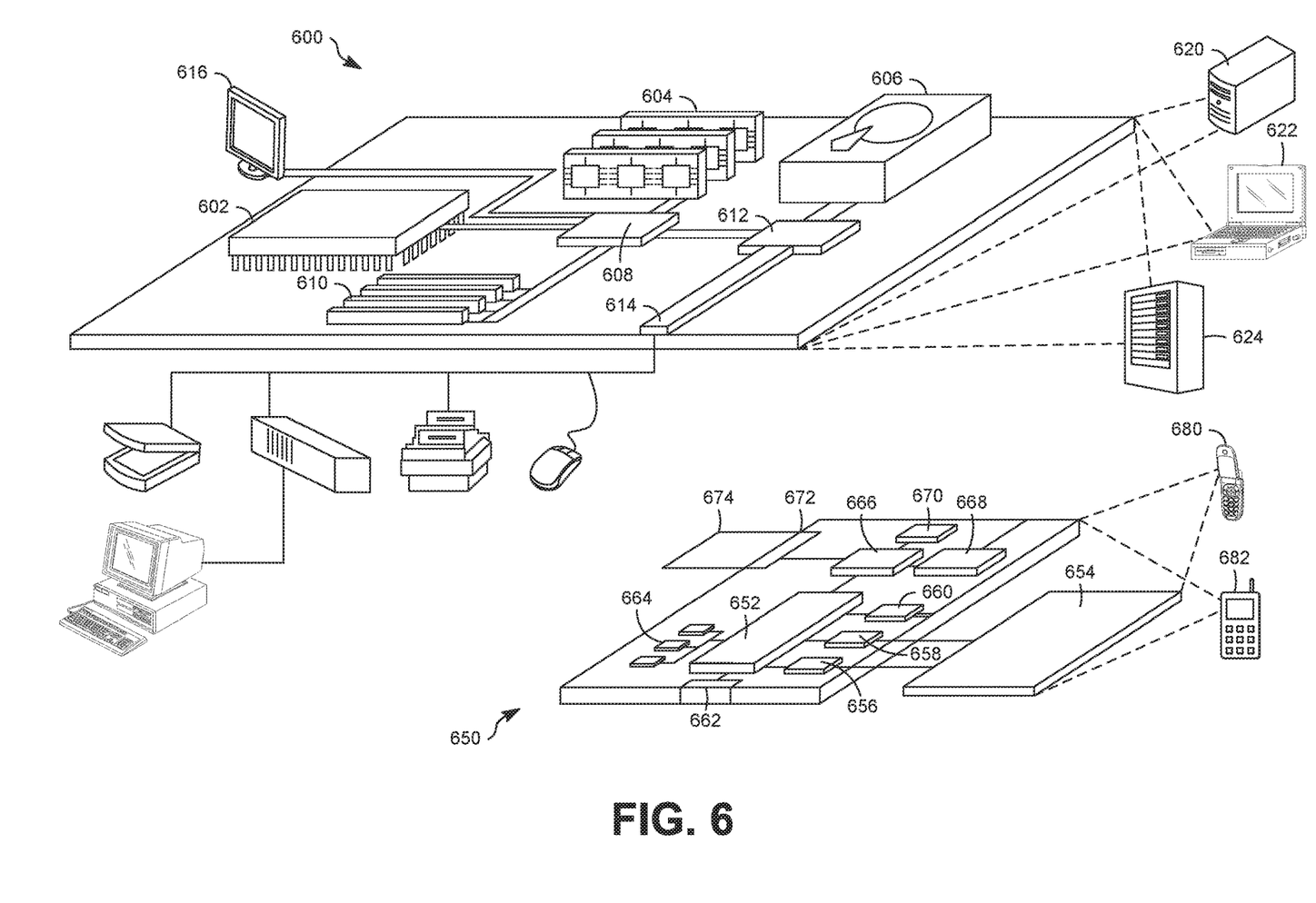
FIG. 6 shows an example of a computer device and a mobile computer device according to at least one example implementation.

FIG. 6 shows an example of a computer device 600 and a mobile computer device 650, which may be used with the techniques described here. Computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. The computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 600, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 606 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provide in communication with processor 652, to enable near area communication of device 650 with other devices. External interface 662 may provide, for example, for wired communication in some implementations, or for wireless communication in other implementations, and multiple interfaces may also be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provide as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652, that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, Wi-Fi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smart phone 682, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. Various implementations of the systems and techniques described here can be realized as and/or generally be referred to herein as a circuit, a module, a block, or a system that can combine software and hardware aspects. For example, a module may include the functions/acts/computer program instructions executing on a processor (e.g., a processor formed on a silicon substrate, a GaAs substrate, and the like) or some other programmable data processing apparatus.

Some of the above example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed above, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

Specific structural and functional details disclosed herein are merely representative for purposes of describing example embodiments. Example embodiments, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term and/or includes any and all combinations of one or more of the associated listed items.

It will be understood that when an element is referred to as being connected or coupled to another element, it can be directly connected or coupled to the other element or intervening elements may be present. In contrast, when an element is referred to as being directly connected or directly coupled to another element, there are no intervening elements present. Other words used to describe the relationship between elements should be interpreted in a like fashion (e.g., between versus directly between, adjacent versus directly adjacent, etc.).

The terminology used herein is for the purpose of describing particular embodiments only and is not intended to be limiting of example embodiments. As used herein, the singular forms a, an and the are intended to include the plural forms as well, unless the context clearly indicates otherwise. It will be further understood that the terms comprises, comprising, includes and/or including, when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the above example implementations and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the above illustrative implementations, reference to acts and symbolic representations of operations (e.g., in the form of flowcharts) that may be implemented as program modules or functional processes include routines, programs, objects, components, data structures, etc., that perform particular tasks or implement particular abstract data types and may be described and/or implemented using existing hardware at existing structural elements. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as processing or computing or calculating or determining of displaying or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the example implementations are typically encoded on some form of non-transitory program storage medium or implemented over some type of transmission medium. The program storage medium may be magnetic (e.g., a floppy disk or a hard drive) or optical (e.g., a compact disk read only memory, or CD ROM), and may be read only or random access. Similarly, the transmission medium may be twisted wire pairs, coaxial cable, optical fiber, or some other suitable transmission medium known to the art. The example implementations not limited by these aspects of any given implementation.

Lastly, it should also be noted that whilst the accompanying claims set out particular combinations of features described herein, the scope of the present disclosure is not limited to the particular combinations hereafter claimed, but instead extends to encompass any combination of features or implementations herein disclosed irrespective of whether or not that particular combination has been specifically enumerated in the accompanying claims at this time.

While example implementations may include various modifications and alternative forms, implementations thereof are shown by way of example in the drawings and will herein be described in detail. It should be understood, however, that there is no intent to limit example implementations to the particular forms disclosed, but on the contrary, example implementations are to cover all modifications, equivalents, and alternatives falling within the scope of the claims. Like numbers refer to like elements throughout the description of the figures.

What is claimed is:

1. A method, comprising:
   determining, at an encoder, whether a dictionary item is available for replacing a block of an image being encoded, the determining based on a hierarchical lookup, the hierarchical lookup including:

generating a projected block based on a corresponding projection matrix; and comparing the projected block with a corresponding threshold; and encoding, at the encoder, the block of the image along with reference information of the dictionary item in response to determining that the dictionary item is available.

2. The method of claim 1, further comprising:
receiving, by the encoder, a dictionary that includes the dictionary item.

3. The method of claim 1, wherein the dictionary item is associated with a feature of the image.

4. The method of claim 1, wherein a size of the block is an 8×8 matrix.

5. A method, comprising:
performing principal component analysis (PCA) on a block to generate a corresponding projected block, the block being associated with a group of images;
comparing the projected block, based on a corresponding projection matrix, with a corresponding threshold;
descending the block recursively based on the threshold until a termination condition is satisfied; and
identifying a left over block as a cluster upon satisfying of the condition.

6. The method of claim 5, wherein the threshold is generated using Otsu's method.

7. An apparatus, comprising:
a decoder configured to decode an encoded image produced by:
determining whether a dictionary item is available for replacing a block of an image being encoded, the determining based on a hierarchical lookup, the hierarchical lookup including:
generating a projected block based on a corresponding projection matrix; and
comparing the projected block with a corresponding threshold,
the encoded image including reference information of the dictionary item in response to determining that the dictionary item is available.

8. The apparatus of claim 7, wherein the decoder is further configured to receive a dictionary that includes the dictionary item.

9. The apparatus of claim 7, wherein the dictionary item is associated with a feature of the image.

10. The apparatus of claim 7, wherein a size of the block is an 8×8 matrix.

11. An encoder, comprising:
a processor; and
a memory, the memory including instructions configured to cause the processor to:
perform principal component analysis (PCA) on a block to generate a corresponding projected block based on a projection matrix, the block being associated with a group of images;
compare the projected block with a corresponding threshold;
descend the block recursively based on the threshold until a condition is satisfied; and
identify a left over block as a cluster upon satisfying of the condition.

12. The encoder of claim 11, wherein the threshold is generated using Otsu's method.

13. A non-transitory computer-readable storage medium having stored thereon computer executable program code which, when executed on a computer system, causes the computer system to perform a method, comprising:
determining, at an encoder, whether a dictionary item is available for replacing a block of an image being encoded, the determining based on a hierarchical lookup, the hierarchical lookup including:
generating a projected block based on a corresponding projection matrix; and
comparing the projection matrix with a corresponding threshold for determining whether the block matches the dictionary item; and
encoding, at the encoder, the image along with reference information of the dictionary item in response to determining that the dictionary item is available.

14. The computer-readable storage medium of claim 13, further comprising code for:
receiving, by the encoder, a dictionary that includes the dictionary item.

15. The computer-readable storage medium of claim 13, wherein a size of the block is an 8×8 matrix.

16. A non-transitory computer-readable storage medium having stored thereon computer executable program code which, when executed on a computer system, causes the computer system to perform a method, comprising:
performing principal component analysis (PCA) on a block to generate a corresponding projected block, the block being associated with a group of images;
comparing the projected block, based on a projection matrix, with a corresponding threshold;
descending the block recursively based on the threshold until a condition is satisfied; and
identifying a left over block as a cluster upon satisfying of the condition.

17. The computer-readable storage medium of claim 16, wherein the threshold is generated using Otsu's method.

18. The computer-readable storage medium of claim 16, wherein the projected block is generated by projecting the projection matrix onto an axis of maximum variance.

19. The computer-readable storage medium of claim 16, wherein the condition is a termination condition.

* * * * *